(12) United States Patent
Amaru et al.

(10) Patent No.: US 11,010,511 B2
(45) Date of Patent: May 18, 2021

(54) SCALABLE BOOLEAN METHODS IN A MODERN SYNTHESIS FLOW

(71) Applicant: Synopsys, Inc., Mountain View, CA (US)

(72) Inventors: Luca Gaetano Amaru, Santa Clara, CA (US); Eleonora Testa, Renens (CH); Patrick Vuillod, St. Bernard du Touvet (FR); Jiong Luo, Fremont, CA (US)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 16/556,600

(22) Filed: Aug. 30, 2019

(65) Prior Publication Data

US 2020/0074019 A1 Mar. 5, 2020

(30) Foreign Application Priority Data

Aug. 31, 2018 (EP) ..................................... 18306156

(51) Int. Cl.
*G06F 30/00* (2020.01)
*G06F 30/20* (2020.01)
*G06F 30/25* (2020.01)
*G06F 30/327* (2020.01)

(52) U.S. Cl.
CPC .............. *G06F 30/20* (2020.01); *G06F 30/25* (2020.01); *G06F 30/327* (2020.01)

(58) Field of Classification Search
CPC .......... G06F 30/20; G06F 30/25; G06F 30/327
See application file for complete search history.

(56) References Cited

U.S. PATENT DOCUMENTS

| | | | | |
|---|---|---|---|---|
| 6,308,299 | B1* | 10/2001 | Burch | G06F 30/3323 716/107 |
| 6,389,374 | B1* | 5/2002 | Jain | G06F 30/3323 703/2 |
| 6,473,884 | B1* | 10/2002 | Ganai | G06F 30/3323 716/107 |
| 6,792,581 | B2* | 9/2004 | Moondanos | G06F 30/3323 716/136 |
| 7,711,525 | B2* | 5/2010 | Ganai | G06F 30/3323 703/2 |
| 10,621,297 | B1* | 4/2020 | Baumgartner | G06F 30/33 |

(Continued)

*Primary Examiner* — Naum Levin
(74) *Attorney, Agent, or Firm* — Park, Vaughan, Fleming & Dowler LLP; Laxman Sahasrabuddhe

(57) ABSTRACT

Techniques and systems for optimizing a logic network are described. Some embodiments automatically identify scenarios where Boolean methods are best driven by truth tables, binary decision diagrams (BDDs) or satisfiability (SAT). Some embodiments use circuit partitioning techniques that are based on hash-tables and topological sorting, and that are capable of grouping nodes with high simplification likelihood and still are able to efficiently scale to large circuits. Some embodiments feature a generalized resubstitution framework based on computing, and implementing, the Boolean difference between two nodes. Some embodiments include enhancements to (i) gradient-based and-inverter-graph (AIG) optimization, (ii) heterogeneous elimination for kerneling, and (iii) revisitation of maximum set of permissible functions (MSPF) computation with BDDs.

20 Claims, 9 Drawing Sheets

Analyze a set of characteristics of the logic network, wherein the set of characteristics includes a count of primary inputs of the logic network ~ 102

Select a logic optimization engine based on said analyzing, wherein the logic optimization engine is selected from a group comprising a truth-table based logic optimization engine, a binary decision diagram (BDD) based logic optimization engine, and a satisfiability (SAT) based logic optimization engine ~ 104

Optimize the logic network by using the selected logic optimization engine ~ 106

(56) References Cited

U.S. PATENT DOCUMENTS

| | | | |
|---|---|---|---|
| 10,740,517 B1* | 8/2020 | Amaru | G06F 30/327 |
| 10,839,117 B1* | 11/2020 | Amaru | G06F 30/327 |
| 2020/0019653 A1* | 1/2020 | Gajavelly | G06F 30/33 |

* cited by examiner

Input: Network $G$, desired characteristics of partions, partition properties enforced via hash tables
Output: Set of processed subnetworks $g_1, g_2, ...g_k$ 1: $nodes2part \leftarrow dfs(G)$
2: $nodes2part \leftarrow array\_sort(nodes2part, comp\_funct)$
3: init $hash\_table(ptr\_cmp, ptr\_hash)$
4: $nPI \leftarrow 0; nInt \leftarrow 0; i \leftarrow 0$
5: for nodes $node$ in $nodes2part$ do
6:     $compute\_property\_key(node, hash\_table)$
7:     if $get(hash\_table, node)$ != NULL then
8:         continue
9:     end if
10:     $newPI \leftarrow 0$
11:     for each fanin $fanin$ in $node$ do
12:         if $get(hash\_table, fanin)$ == NULL then
13:             $newPI \leftarrow 1$; break
14:         end if
15:     end for
16:     if $newPI$ then
17:         $nPI$++
18:     else
19:         $nInt$++
20:     end if
21:     $put(hash\_table, property\_key, node)$
22:     if partition $i$ chars are met then
23:         $hash\_table$ is associated to partition $g_i$
24:         $processing(g_i)$; import back result
25:         $i$++; $nPI \leftarrow 0$; $nInt \leftarrow 0$; close $hash\_table$
26:         init $hash\_table(ptr\_cmp, ptr\_hash)$
27:     end if
28: end for

FIG. 2

```
1: procedure RECONVERGENT_MFFC(n)
2:     if marked(n) ∨ (n ∈ PI) then
3:         return
4:     end if
5:     Mark n
6:     for Each children c of node n do
7:         flag ← 0
8:         if marked(c) ∨ c ∈ PI then
9:             continue
10:        end if
11:        for Each parent p of node c do
12:            if not_marked(p) then
13:                flag ← 1
14:                break
15:            end if
16:        end for
17:        if flag = 1 then
18:            continue
19:        end if
20:        RECONVERGENT_MFFC(c)
21:    end for
end procedure
```

FIG. 3

```
1: procedure GOOD_CANDIDATES(F, G, xor_cost)
2:     saving ← mffc_size(F)
3:     if saving < 2 then
4:         return false
5:     end if
6:     if saving < xor_cost then
7:         return false
8:     end if
9:     if f ∈ cuts(G) then
10:        return false
11:    end if
12:    common_size ← common_support(F, G)
13:    if common_size < 1 then
14:        return false
15:    end if
16:    return true
17: end procedure
```

```
1: procedure BOOLEAN_DIFFERENCE(F, G, xor_cost)
2:     saving ← mffc_size(F)
3:     bddf ← BDD(F)
4:     bddg ← BDD(G)
5:     bdd_diff ← bddf ⊕ bddg
6:     if size(bdd_diff) < 1 then
7:         return F
8:     end if
9:     if size(bdd_diff) > 10 then
10:        return F
11:    end if
12:    if size(bdd_diff) + xor_cost > saving then
13:        return F
14:    end if
15:    bdiff_node ← bdd_to_node(bdd_diff)
16:    F' ← bdiff_node ⊕ G
17:    return F'
18: end procedure
```

FIG. 6

Input: Network $N$, level, xor_cost
Output: Optimized network $N'$.
1: $N' \leftarrow N$
2: $list \leftarrow topological\_sort(N)$
3: for nodes $f$ in $list$ do
4:     for nodes $g$ in $list$ do
5:         if $f = g$ then
6:             continue
7:         end if
8:         $F \leftarrow subnetwork(f, level)$
9:         $G \leftarrow subnetwork(g, level)$
10:         if !GOOD_CANDIDATES($F, G, xor\_cost$) then
11:             continue
12:         end if
13:         $F' \leftarrow$ BOOLEAN_DIFFERENCE($F, G, xor\_cost$)
14:         $N'' \leftarrow N$
15:         Change $F$ with $F'$ in $N''$
16:         if $size(N'') < size(N')$ then
17:             Change $F$ with $F'$ in $N'$
18:         end if
19:     end for
20: end for
21: return $N'$

FIG. 7A

SCALABLE BOOLEAN METHODS IN A MODERN SYNTHESIS FLOW

RELATED APPLICATION

This application claims priority, under 35 U.S.C. § 119(a), to European Provisional Patent Application No. EP18306156, filed on 31 Aug. 2018, the contents of which are herein incorporated by reference in their entirety for all purposes.

COPYRIGHT NOTICE

The assignee of this patent document does not object to the facsimile reproduction of the patent document as it appears in the files of the United States Patent and Trademark Office, but otherwise reserves all rights whatsoever in any included works of authorship protected by copyright.

BACKGROUND

Technical Field

This disclosure relates to integrated circuits (ICs). More specifically, this disclosure relates to scalable Boolean techniques and systems in modern synthesis flows.

Related Art

As transistor scaling slows down at advanced technology nodes, e.g., 10, 8, 7 nm and beyond, Electronic Design Automation (EDA) innovations are becoming even more important to bridge the gap in (expected) Quality of Results (QoR). Approaches to logic network optimization have historically been divided into algebraic methods and Boolean methods. While algebraic methods are faster, Boolean methods achieve better results (see e.g., G. De Micheli, "Synthesis and Optimization of Digital Circuits", McGraw-Hill, New York, 1994). Unfortunately, the application of Boolean methods comes at higher computational cost and less scalability.

When using Boolean methods, the logic network is optimized by making use of local transformations obtained by considering Boolean algebra and local don't cares. Due to observability and controllability don't cares, often the function at a node n in the logic network can be replaced with another function without changing the behavior at the primary outputs (POs) of the logic network. The new function is called a permissible function for node n (see e.g., S. Muroga, "Logic Synthesizers, The Transduction Method and Its Extension, Sylon", Logic Synthesis and Optimization, Springer US: 59-86, 1993, and S. Muroga, et al. "The transduction method-design of logic networks based on permissible functions", IEEE Trans. on Computers 38(10): 1404-1424, 1989), and the set of all permissible functions for node n is its maximum set of permissible functions (MSPF). Boolean logic optimization can be performed based on truth tables, binary decision diagrams (BDDs) and satisfiability (SAT) solvers.

A truth table is a canonical representation of a Boolean function where the function values are listed for all possible input combinations. When Boolean methods are applied to small windows of logic, they enable very fast implementation and can be used for fast equivalence checking of two functions. They are usually used together with partitioning techniques to allow Boolean optimization. A Boolean resynthesis flow, which makes use of truth tables as data structure for MSPF calculation, was described in L. Amaru, M. Soeken, P. Vuillod, J. Luo, A. Mishchenko, J. Olson, R. Brayton, G. De Micheli, "Improvements to Boolean Resynthesis," Design, Automation & Test in Europe Conference (DATE), 2018. In the above-mentioned research paper, partitioning approaches are interleaved with filtering techniques in order to allow significant improvement at a reasonable runtime cost.

Binary decision diagram (BDD) (see e.g., Randal E. Bryant. "Graph-Based Algorithms for Boolean Function Manipulation," IEEE Trans. on Computers, 35(8):677691, 1986) are directed acyclic graphs representing a Boolean function. Each internal node in a BDD implements the Shannon expansion of the function with respect to a variable $x_i$:

$$f = x_i f_{x_i} \oplus \bar{x}_i f_{\bar{x}_i}$$

where $f_{x_i}$ and $f_{\bar{x}_i}$ are the cofactors obtained from $f$ when the variable $x_i$ is assigned 1 or 0, respectively. Just like truth tables, BDDs can be used to check if one function is a permissible replacement of another function. This is usually performed by checking the tautology of their equivalence. The permissible functions can be quickly evaluated using BDD tools, as they allow fast tautology checks. BDDs have been largely exploited for logic functions decomposition. The decomposition process is performed on the BDD by making use of dominators nodes, which identify the structures for a particular decomposition type (i.e., AND/OR, XOR, MAJ). As an example, "BDS" (see e.g., C. Yang and M. Ciesielski, "BDS: a BDD-based logic optimization system," IEEE Trans. on Computer-Aided Design, 21(7), 866-876, 2002) is an optimization system for the synthesis of AND/OR and XOR-based functions, which use a dominator based decomposition method on BDDs. Both algebraic and Boolean decompositions are used, as in the previous case, a partitioned Boolean network is considered in order to allow efficient BDDs computation. An extension that considers majority decomposition is illustrated in L. Amaru, P.-E. Gaillardon, and G. De Micheli. "BDS-MAJ: A BDD-based logic synthesis tool exploiting majority logic decomposition," Design Automation Conference (DAC), 2013.

SAT solvers have recently been used to search permissible functions. This is possible by changing the search for permissible functions into a satisfiability problem. A SAT problem takes a formula representing a Boolean function and decides whether or not there is an assignment of the variables for which the function in equal to 1 (i.e., whether or not the function is satisfiable). If no assignment is found, then the formula is said to be unsatisfiable. The work in A. Mishchenko, et al. "Scalable don't-care-based logic optimization and resynthesis", ACM Transactions on Reconfigurable Technology and Systems (TRETS) 4(4): 34, 2001, provides details on how to cast don't cares computation into a SAT problem. In the above-mentioned research paper, a miter configuration is proposed, similar to the one for equivalence checking, and a windowing method is presented in order to make the SAT solver approach more efficient. Recently, an updated version of the SAT-based don't cares computation has been proposed in A. Mishchenko, R. Brayton, A. Petkovska, and M. Soeken, "SAT-based optimization with don't-cares revisited", International Workshop on Logic and Synthesis, 2017.

The above-mentioned techniques are typically used for verifying permissible functions, and thus for verifying the applicability of Boolean transformations. One example of a Boolean transformation is called a resubstitution, which is a Boolean transformation that rewrites the function of a node n using other nodes already present in the network. Logic optimization is achieved when the new implementation of the node is better than the current one for a given target metric. A generalization to resubstitution is given by a k-resubstitution, which adds k new nodes to the logic network, but at the same time it removes l (the English lowercase letter "el") old nodes in the maximum fanout free cone of node n (see e.g., A. Mishchenko, S. Chatterjee, R. Brayton, "DAG-aware AIG rewriting a fresh look at combinational logic synthesis", Design Automation Conference (DAC), 2006). As an example, if we are optimizing a size metric that is defined based on the number of nodes, then size optimization is achieved in k-resubstitution when l>k.

An extensive review on Boolean methods and other transformations can be found in R. K. Brayton, G. D. Hachtel, A. L. Sangiovanni-Vincentelli, "Multilevel logic synthesis", Proc. of the IEEE 78(2):264-300, 1990, G. De Micheli, "Synthesis and Optimization of Digital Circuits", McGraw-Hill, New York, 1994, and Khatri, Sunil P., and Kanupriya Gulati. "Advanced techniques in logic synthesis, optimizations and applications", Springer, 2011.

Boolean optimization methods are known to be more powerful than algebraic methods, but they come with a higher computational cost. Due to the higher computational cost of existing implementations of Boolean optimization methods, their applicability in automated IC design is limited.

SUMMARY

This section is not intended to limit the scope of the disclosed subject matter. The disclosed subject matter is to be accorded the widest scope consistent with the principles and features disclosed in the entire disclosure. Some embodiments described herein provide scalable Boolean techniques and systems in modern synthesis flows. In particular, some embodiments described herein provide techniques and systems to use different engines and partition methods to unlock new logic optimization opportunities, at reasonable computational cost.

Some embodiments optimize a logic network by (1) analyzing a set of characteristics of the logic network, the set of characteristics including a count of primary inputs of the logic network; (2) selecting a logic optimization engine based on said analyzing, the logic optimization engine being selected from a group comprising a truth-table based logic optimization engine, a binary decision diagram (BDD) based logic optimization engine, and a satisfiability (SAT) based logic optimization engine; and (3) optimizing the logic network by using the logic optimization engine.

In some embodiments, the set of characteristics includes a depth of an and-inverter-graph (AIG) decomposition of the logic network. In some embodiments, the set of characteristics includes a ratio between a count of internal nodes of the logic network and the count of primary inputs of the logic network. In some embodiments, the set of characteristics includes a monotonicity characteristic that indicates whether or not the logic network shows monotonicity. In some embodiments, the set of characteristics includes a symmetry characteristic that indicates whether or not the logic network shows symmetry.

In some embodiments, selecting the logic optimization engine comprises selecting the truth-table based logic optimization engine when the count of primary inputs of the logic network is less than a first predetermined value. In some embodiments, selecting the logic optimization engine comprises selecting the BDD based logic optimization engine when the count of primary inputs of the logic network is greater than or equal to a first predetermined value, but less than a second predetermined value. In some embodiments, selecting the logic optimization engine comprises selecting the SAT based logic optimization engine when the count of primary inputs of the logic network is greater than or equal to the second predetermined value.

Some embodiments optimize a logic network by (1) obtaining a sorted list of nodes by at least sorting nodes in the logic network in topological order; and (2) iteratively performing a set of operations, comprising: selecting a first node and a second node from the sorted list of nodes, determining a first sub-network and a second sub-network corresponding to the first node and the second node, respectively, responsive to determining that the first sub-network and the second sub-network are good candidates for performing Boolean difference based resubstitution optimization, computing an optimized sub-network based on the first sub-network and the second sub-network by using Boolean difference based resubstitution optimization, and responsive to determining that replacing the first sub-network and the second sub-network by the optimized sub-network reduces a size metric of the logic network, replacing the first sub-network and the second sub-network in the logic network by the optimized sub-network.

In some embodiments, the set of operations comprises determining that the first sub-network and the second sub-network are good candidates for performing Boolean difference based resubstitution optimization by: determining a reconvergent maximum fanout free cone of the first sub-network, determining a count of input variables that are common to the first sub-network and the second sub-network, and determining whether or not the first sub-network and the second sub-network are good candidates for performing Boolean difference based resubstitution optimization based on the reconvergent maximum fanout free cone of the first sub-network and the count of input variables that are common to the first sub-network and the second sub-network.

In some embodiments, the set of operations comprises determining that replacing the first sub-network and the second sub-network by the optimized sub-network reduces the size metric of the logic network by: obtaining a resubstituted logic network by replacing the first sub-network and the second sub-network by the optimized sub-network, and comparing a size metric of the logic network with a size metric of the resubstituted logic network.

In some embodiments, obtaining the sorted list of nodes comprises moving nodes that have similar structural support closer to one another in the sorted list of nodes while respecting the topological order.

BRIEF DESCRIPTION OF THE FIGURES

FIG. 2 illustrates a process for partitioning a circuit in accordance with some embodiments described herein.

FIG. 3 illustrates a process for detecting the reconvergent MFFC in accordance with some embodiments described herein.

FIG. 6 illustrates a process for computing and implementing the Boolean difference of two candidate functions f and g in accordance with some embodiments described herein.

FIGS. 7A-7B illustrate a process for a resubstitution synthesis flow based on Boolean difference in accordance with some embodiments described herein.

DETAILED DESCRIPTION

Figure 1:
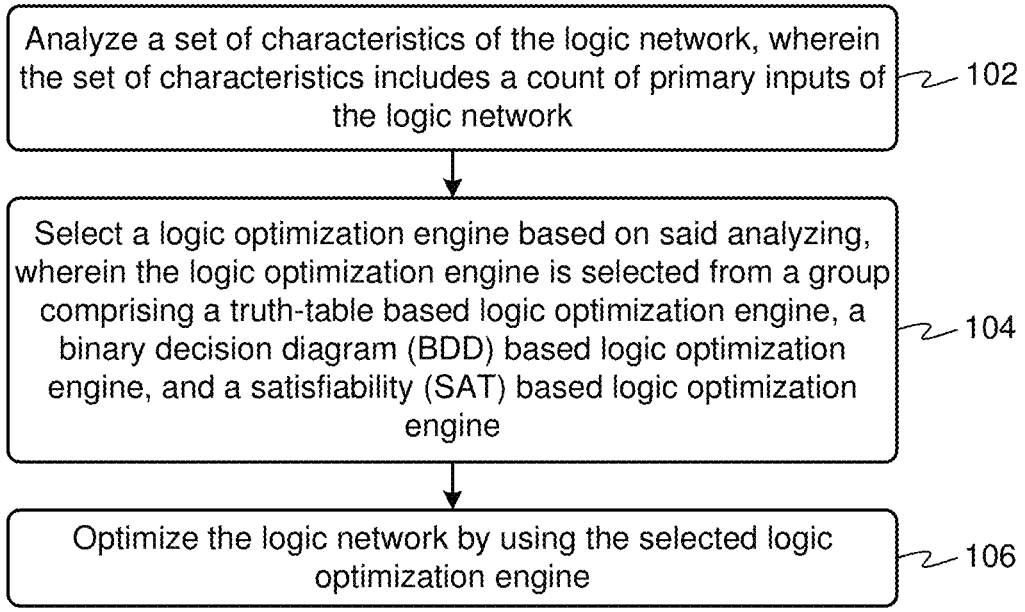
FIG. 1 illustrates a process for selecting an optimization engine in accordance with some embodiments described herein.

The following description is presented to enable any person skilled in the art to make and use the claimed invention(s), and is provided in the context of particular application(s) and/or environment(s). Various modifications to the disclosed embodiments will be readily apparent to those skilled in the art, and the general principles defined herein may be applied to other embodiments and applications without departing from the spirit and scope of the disclosure. Thus, the disclosed subject matter is not limited to the embodiments shown, but is to be accorded the widest scope consistent with the principles and features disclosed herein.

In this disclosure, numerous specific details may be described to enable one or more of the embodiments. In the interest of not obscuring the presentation of the embodiments, some features that are known in the art may be combined together, may be described in less detail, or may be implied (i.e., some well-known features may not be explicitly described). Furthermore, while this description may refer to some features in the singular tense, more than one instance of the feature may be illustrated in the figures, and like components are labeled with like numerals.

An IC design and manufacturing process produces IC chips. IC design software tools can be used to create an IC design. Once the IC design is finalized, it can undergo fabrication, packaging, and assembly to produce IC chips. The overall IC design and manufacturing process can involve multiple entities, e.g., one company may create the software for designing ICs, another company may use the software to create the IC design, and yet another company may manufacture IC chips based on the IC design. An IC design flow can include multiple steps, and each step can involve using one or more IC design software tools. An improvement to one or more of these steps in the IC design flow results in an improvement to the overall IC design and manufacturing process. Specifically, the improved IC design and manufacturing process can produce IC chips with a shorter time-to-market (TTM) and/or higher quality of results.

As an IC design progresses through an IC design flow, the IC design can be represented at different levels of abstraction by using different data formats or languages. In general, higher levels of abstraction contain fewer details of the IC design than lower levels of abstraction. Typically, the IC design is described at a high level of abstraction in the early stages of the IC design flow, and the level of abstraction becomes progressively lower as the IC design moves through the IC design flow (i.e., the description of the IC design becomes more specific as the IC design progresses through the IC design flow).

For example, toward the beginning of the IC design flow, an IC design can be described at a high level of abstraction by using a hardware description language (HDL) which describes the functionality of the IC design but does not include information about the actual geometric shapes that will be printed on the wafer. Toward the end of the IC design flow, the same IC design can be represented in a low level of abstraction by using a data format or language such as GDSII or OASIS, which contains a description of the actual geometric shapes that are to be printed on the wafer. In between these two ends of the IC design flow, the IC design may be represented in numerous data formats or languages that describe the same IC design at different levels of abstraction.

Some examples of IC design steps and the associated software tools are described below. These examples are for illustrative purposes only and are not intended to limit the embodiments to the forms disclosed. This disclosure describes techniques and systems that can be used in one or more IC design steps.

IC design software tools enable IC designers to describe the functionality that the IC designers want to implement. These tools also enable IC designers to perform what-if planning to refine functionality, check costs, etc. During logic design and functional verification, the HDL, e.g., SystemVerilog, code can be written and the design can be checked for functional accuracy, e.g., the design can be checked to ensure that it produces the correct outputs.

During synthesis and design for test, the HDL code can be translated to a netlist using one or more IC design software tools. Further, the netlist can be optimized for the target technology, and tests can be designed and implemented to check the finished chips. During netlist verification, the netlist can be checked for compliance with timing constraints and for correspondence (i.e., equivalence checking) with the RTL design and/or HDL code.

During design planning, an overall floorplan for the chip can be constructed and analyzed for timing and top-level routing. During physical implementation, circuit elements can be positioned in the layout and can be electrically connected.

During analysis and extraction, the IC design's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

As mentioned above, the HDL code can be translated to a netlist during synthesis. A netlist describes a network of logical building blocks (e.g., AND gates, OR gates, MUXs, etc.) that implement the desired functionality of the IC design. After the synthesis stage, the IC design flow can perform placement, during which the network of logical building blocks is implemented by using a network of cells. A cell represents an actual portion of the physical IC chip that will be created when the IC design is manufactured. Placement involves assigning a physical location to each cell in the IC design. After placement, the IC design flow can perform routing, which involves determining routes for metal wires to electrically connect the placed cells.

A netlist is a list (or collection) of "nets." Each "net" refers to a set of gates (or cells) whose inputs/outputs are electrically connected. For example, suppose a driver cell drives the inputs of a set of driven cells. In this example, the term "net" can refer to the portion of the netlist that includes the driver cell, the set of driven cells, and the electrical connections (e.g., the network of metal wires) that connect the output of the driver cell and the inputs of the set of driven cells. Each of these steps—synthesis, placement, and routing—is complex and includes multiple sub-steps. During an actual IC design flow, multiple iterations may be required before the IC design converges and meets the desired performance and yield targets.

Overview

This disclosure features effective Boolean methods that are designed to be scalable in a modern synthesis flow. Some embodiments can automatically identify scenarios where Boolean methods are best driven by truth tables, BDDs or SAT. Embodiments disclosed herein use circuit partitioning techniques that are based on hash-tables and topological sorting, and that are capable of grouping nodes with high simplification likelihood and still efficiently scaling to large circuits. Boolean methods are then selectively applied to partitioned circuits. This disclosure also describes a generalized resubstitution framework based on computing, and implementing, the Boolean difference between two nodes. Embodiments described herein include intelligent optimization engines, such as (i) gradient-based AIG optimization, (ii) heterogeneous elimination for kerneling, and (iii) revisitation of MSPF computation with BDDs. Altogether, the disclosed embodiments show strong improvements over the smallest known AIGs for EPFL benchmarks. When implemented in a commercial EDA flow for ASICs, the disclosed embodiments enable −2.14% area savings and −5.83% total negative slack reduction, after physical implementation, at reasonable runtime cost.

Boolean methods rely on complete functional properties of a logic circuit, preferably including don't care information. In order to gather such functional properties, expensive logic reasoning engines are required, such as truth tables, BDDs and SAT. In the last two decades, improvements in SAT solving made SAT-based methods sensibly more scalable than those based on BDDs. As a consequence, some Boolean methods based on BDDs or truth tables grew outdated. Although SAT-based methods have their advantages, it appears in practice that there are still several synthesis scenarios in which BDDs or truth tables are preferable to SAT, in terms of QoR and/or runtime.

The following sections describe techniques and systems for automatically identifying scenarios, based on circuit characteristics and optimization scope, where Boolean methods are best driven by either truth tables, BDDs, SAT, or a combination of those.

Truth Tables

Truth tables are efficiently stored in computers as concatenation of words. Each 64-bit (32-bit) word can store the truth table for a 6 (5) variables function. Generic functions with n variables, require $2^{n-k}$ words, where $k=\log_2(\text{word-size})$.

For circuits, or sub-circuits, having less than 16 primary inputs (PIs), truth tables are remarkably quick to compute in practice. This is also thanks to the fact that truth table computation can be parallelized with respect to words and distributed over different threads. For example, if one considers 64 bit words, operating with a 16 input truth table requires bit-level operations among 1024 (independent) words. Distributing such computation over 16 threads, which is common in EDA applications, reduces the latency bottleneck to just 64 consecutive bit-level word operations, in order to manipulate a 16 input truth table in parallel.

It is easy to see that functional properties of circuits up to 16 inputs are most efficiently computed via truth tables, as of today. The overhead of formulating and solving a SAT problem, or handling a BDD manager for the same circuit usually takes much more runtime.

To provide a concrete example, let us consider a XOR-rich parity circuit over 16 variables, with many functionally identical nodes originating from partial SOP collapsing during synthesis. The circuit size can easily go over several thousands of nodes, depending on how deep collapsing of XORs went, in our case we deal with about 10 k AIG nodes. Let us assume we want to merge all functionally equivalent nodes, up to complementation, in this circuit. If we perform this task using truth tables, it takes about 1 second of runtime. For comparison, using a SAT-based formulation of the problem would take more than 2 minutes to obtain the same result. BDD-based methods for this case take tens of seconds, ranging between 15 s and 30 s, depending on the settings for static & dynamic variable reordering. It is clear from this example that choosing the correct technique for performing logic optimization can have a significant impact on the QoR and/or runtime required to perform logic optimization.

BDDs

BDDs are a compact canonical representation form. As compared to truth tables, which are also canonical but always exponential sized, BDDs enjoy polynomial size for many functions and variable orderings are of practical interest. However, for some functions, like multiplication and HWB (see e.g., "Hidden-weighted bit (hwb) functions", IEEE Trans., C-40, 208-210, 1991), BDDs are exponential sized for any variable order. When dealing with a medium-to-large arbitrary function whose exact properties are unknown, BDDs construction time can vary sensibly. Based on our experiments, BDDs were always built very quickly, comparably to truth tables, for the following circuit, or sub-circuit, cases: 1) circuit has less than 20 primary inputs, 2) circuit, if decomposed into AIG, has depth d<20 levels, 3) circuit has small internal nodes over primary inputs ratio, i.e., volume v<2, and 4) circuit shows special properties, e.g., monotonicity, symmetries, which are known to facilitate BDD construction.

In the above-mentioned cases, when |PI|>16 (i.e., the number of primary inputs is greater than 16), truth tables are not desirable. In such cases, BDDs are the fastest alternative in the majority of cases. It is worth noticing that corner cases for points 3) and 4) exist, i.e., ripple carry adders whose BDDs are build with bad variable order, symmetric functions with too many variables, etc. However, these cases are small fraction of the ones encountered in practice and can be detected with some extra filtering.

To use a concrete example, let us consider a Boolean resub over the MCNC circuit k2 (see S. Yang, "Logic Synthesis and Optimization Version 3.0, Technical Report MCNC P.O. Box 12889, Research Triangle Park, NC 27709, 1991. [28] Amaru, L., P.-E. Gaillardon, and G. De Micheli. "BDS-MAJ: A BDD based logic synthesis tool exploiting majority logic decomposition, Design Automation Conference (DAC), 2013). After decomposing into AIG, with light sharing, this circuit shows 20 levels, 2580 nodes and 45/45 PI/PO. Building a BDD for this circuit takes less than 10 ms with a modern BDD package. Such BDD can then be used for implementing the Boolean filtering rules described in L. Amaru, M. Soeken, P. Vuillod, J. Luo, A. Mishchenko, J. Olson, R. Brayton, G. De Micheli, "Improvements to Boolean Resynthesis", Design, Automation & Test in Europe Conference (DATE), 2018, in the same way as would be implemented with truth tables. Calling SAT instead for each resub move, spanning the whole circuit, would result in notable runtime overhead.

SAT

SAT solving provides yes-no answers to complex Boolean problems. Many Boolean methods in synthesis can be formulated as problems requiring yes-no answers, e.g., "is this portion of logic redundant?" Advances in SAT solving have made very large problems solvable in relatively short runtime. As a consequence, SAT is very appealing in logic synthesis and other fields in EDA. It is fair mentioning that there is some overhead in translating circuit-SAT problems in Conjunctive Normal Form (CNF), the standard form for actually solving SAT. Also, SAT returns only a binary answer, so it provides less information content with respect to BDDs or truth tables, which encapsulate complete functional information. Nevertheless, SAT offers scalability after truth tables and BDDs stop being useful. Indeed, SAT is the preferred engine for Boolean methods in the following cases: 1) the Boolean method we are dealing with is global in nature, and can be formulated as a yes-no question, 2) implicit enumeration and pruning of large search spaces is required, which is efficiently done by modern SAT solvers, and 3) it does not fit with the previous truth tables and BDD preferable cases.

To use a concrete example, let us consider Redundancy Removal (RR) over the EPFL circuit mem ctrl (see e.g., L. Amaru, P.-E. Gaillardon, G. De Micheli, "The EPFL Combinational Benchmark Suite" International Workshop on Logic & Synthesis (IWLS), 2015). After decomposing into AIG, with light sharing, this circuit shows 115 levels, 46 k nodes and 1205/1231 PI/PO. Given its size, it is apparent that finding global redundancies via truth tables or BDDs is not feasible. On the other hand, RR based on SAT formulation and solving is capable to process this benchmark. In about 30 seconds, SAT-based RR is able to remove 11.8 k nodes in the AIG that are proven redundant.

Process for Selecting an Optimization Engine

FIG. 1 illustrates a process for selecting an optimization engine in accordance with some embodiments described herein. The process can begin by analyzing a set of characteristics of the logic network, the set of characteristics including a count of primary inputs of the logic network (operation 102). The set of characteristics can also include (1) a depth of an AIG decomposition of the logic network, (2) a ratio between a count of internal nodes of the logic network and the count of primary inputs of the logic network, (3) a monotonicity characteristic that indicates whether or not the logic network shows monotonicity, and (4) a symmetry characteristic that indicates whether or not the logic network shows symmetry.

A logic network can be considered to be a Boolean function $f$ that produces an output value for a given set of input values. According to one definition, a logic network $f$ is considered to be monotone if for all sets of input values $S \subset T, f(S) \leq f(T)$. In other words, increasing the size of the set of input values can only increase the value off. Stated differently, replacing a 0 with a 1 in any of the inputs of a monotone logic network only increases the output's value. Examples of monotone functions include, but are not limited to, the "OR" function, the "AND" function, and the majority function. According to one definition, a logic network $f$ is considered to be symmetric if the output value does not depend on the permutation of its input values, i.e., the output of the logic network depends only on the number of ones and zeroes that are provided as inputs. Examples of symmetric functions include, but are not limited to, threshold functions, exact-value functions, counting functions, and parity functions.

Next, the process can select a logic optimization engine based on said analyzing, the logic optimization engine being selected from a group comprising a truth-table based logic optimization engine, a BDD based logic optimization engine, and a SAT based logic optimization engine (operation 104). In some embodiments, selecting the logic optimization engine comprises: selecting the truth-table based logic optimization engine when the count of primary inputs of the logic network is less than a first predetermined value (e.g., when the count of primary inputs is less than 16); selecting the BDD based logic optimization engine when the count of primary inputs of the logic network is greater than or equal to a first predetermined value, but less than a second predetermined value (e.g., when the count of primary inputs is between 16 and 20); and selecting the SAT based logic optimization engine when the count of primary inputs of the logic network is greater than or equal to the second predetermined value (e.g., when the count of primary inputs is greater than or equal to 20). The process can then optimize the logic network by using the selected logic optimization engine (operation 106).

Efficient Circuit Partitioning

Boolean methods achieve better results and are more precise than algebraic methods, but they have worse scalability. The right engine selection determines the scalability of the Boolean methods, but their application is still limited to small functions. Partitioning and breaking down the logic network into smaller subnetworks is thus needed to be able to apply Boolean methods in (i) an efficient way and (ii) on large networks. This section describes approaches for circuits partitioning that allow the application of expensive Boolean methods in a general synthesis flow.

Cut enumeration is employed to identify subsets of k inputs functions inside a larger network. Usually k is in the order of 6 or 7, while it is not practical for larger values. A cut c of a node v in the logic network is a set of nodes, called leaves, such that: (1) every path from node v to a terminal node visits at least one leaf, and (2) each leaf is contained in at least one path. Node v is called the root of the cut and each cut represents a subgraph that includes the root v, the leaves, and some internal nodes. A cut is k-feasible (denoted here as k-cut), if it has a number of leaves≤k. Further details on cuts can be found in A. Mishchenko, S. Chatterjee and R. K. Brayton, "Improvements to Technology Mapping for LUT-Based FPGAs," IEEE Trans. on Computer-Aided Design, 26(2): 240-253, 2007.

A bottom-up technique for generating all k-feasible cuts using a recursive approach is described in P. Pan and C.-C. Lin, "A New Retiming-Based Technology Mapping Algorithm for LUT-based FPGAs", FPGA, 35-42, 1998, and Cong, J. and Wu, C. and Ding, Y., "Cut Ranking and Pruning: Enabling a General and Efficient FPGA Mapping Solution", Proceedings of the 1999 ACM/SIGDA Seventh International Symposium on Field Programmable Gate Arrays, 1999. The bottom-up approach is based on the fact that it is possible to find all the k-feasible non-trivial cuts of node n by merging the cuts of its children. Each primary input has its trivial cut only and we can enumerate the k-cuts of all nodes using the recursive approach in a depth-first manner. Further details on the merge functions and this cut enumeration can be found in the above-mentioned documents.

A top-down technique for cut enumeration is described in A. Mishchenko, S. Chatterjee and R. K. Brayton, "Improvements to Technology Mapping for LUT-Based FPGAs," IEEE Trans. on Computer-Aided Design, 26(2): 240-253, 2007. This approach proceeds in a top-down manner, from primary outputs down to primary inputs. The approach makes use of cuts factorization using local cuts and global cuts. These are collectively known as factor cuts. For each node n, the method is based on the expansion of a factor cut with local cuts to obtain a larger set of cuts. The approach allows the enumeration of all k-feasible cuts, but it also allows partial enumeration for memory saving. All details about local, global cuts and the top-down approach can be found in the above-mentioned document.

Many optimization methods require coarse grain circuit partitioning which is not efficiently achievable by cut enumeration. In such cases, methods other than the above-mentioned techniques for circuit partitioning are needed. Ideally, we would like methods for large scale partitioning to be: (1) linear, or at most quasilinear, average time complexity with respect to circuit size n, (2) highly tunable with respect to desired number of primary inputs, volume, and overlap between partitions, (3) possibly building partitions that respect some special property by construction, and (4) obtain partitions with group of nodes with high likelihood to result in logic simplifications and optimizations.

FIG. 2 illustrates a process for partitioning a circuit in accordance with some embodiments described herein. The large-scale circuit partitioning process depicted in FIG. 2 has the above-mentioned properties that are desirable in a large-scale partitioning technique. The process first starts by collecting the nodes of the network in an array topologically ordered, via Depth First Search (DFS), and then further sorts the array (lines 1-2 in FIG. 2). To sort the array a special comparison function comp_junct is used, which respects the topological order and aims at moving closer nodes with similar structural support. Nodes with similar structural support are more likely to lead to logic simplification and optimization when grouped together in a partition.

Next, a loop over the sorted array starts in order to create the actual partitions (lines 5-28 in FIG. 2). Each partition respects some predefined characteristic, e.g., number of PIs, maximum/minimum volume, etc. The loop makes use of a hash table to check which nodes need skipping (lines 7-9 in FIG. 2), which are part of internal nodes/PIs (lines 10-20 in FIG. 2), and which nodes respect desired properties in the partition (lines 21-27 in FIG. 2). Please note that if no property is being computed while partitioning, the hash tables can be replaced by simple node marking and unmarking. However, some interesting properties can be encoded in hash tables at the same time of computing partitions, with no or very small runtime overhead. Such properties can be useful to keep partitions small, by compacting the logic, or to respect some special criteria by construction. For example, BDDs can be used to obtain unique id keys making partitions functionally reduced by construction. As BDDs are often used by successive Boolean methods processing the partitions, the BDDs will be computed only once and then their manager passed together with the partition. In addition, limitations to variables connections, e.g., don't touch logic and others, can be encoded as property key (computed in line 6 in FIG. 2).

With such large scale partitioning method, portion of circuits with 100-10 k nodes can be computed, and functionally hashed, in a scalable way, with perceived linear time complexity. For example, for the EPFL benchmark log 2 (see e.g., L. Amaru, P.-E. Gaillardon, G. De Micheli, "The EPFL Combinational Benchmark Suite" International Workshop on Logic & Synthesis (IWLS), 2015), consider partitioning from its original AIG (50 k nodes) and just functionally reducing them. If we use BDDs to compute unique ids as property keys in line 6 of FIG. 2, this is intrinsically done while building partitions. We consider as partition characteristics number of PIs equal to 400, maximum number of internal nodes 5000 and minimum volume 1.5. Note that the maximum number of internal nodes is not always reached. A total number of 54 partitions are created in this way, and 243 nodes were saved in total, in about 0.4 s runtime. For the sake of comparison, running a SAT-based functional reduction on the whole AIG takes about 3 seconds and shows similar savings.

Detecting all reconvergent maximum fanout free cone MFFC is a special case scenario. The reconvergent MFFC of a node n is a subnetwork that contains all the logic nodes used only by the node n. More formally, it is defined as a subset of the fanin cone of node n such that every path from a node in the subset to the POs passes through n itself (see e.g., A. Mishchenko, S. Chatterjee and R. K. Brayton, "Improvements to Technology Mapping for LUT-Based FPGAs," IEEE Trans. on Computer-Aided Design, 26(2): 240-253, 2007). Thus, when a node n is substituted or removed, also its MFFC can be removed from the logic network. It follows that optimization methods can change and rewrite the MFFC without affecting the rest of the network.

FIG. 3 illustrates a process for detecting the reconvergent MFFC in accordance with some embodiments described herein. The pseudocode shown in FIG. 3 marks all nodes that are in the MFFC of node n by recursively applying the process on all the children of node n. The recursion ends when (i) the node is a PI—see lines 2-4 in FIG. 3, (ii) the node is already marked (i.e., has already been visited once)—see lines 2-4 in FIG. 3, or (iii) the node has a fan-out which is not marked (i.e., a path that does not pass through n)—see lines 11-19 in FIG. 3. At the end of the process, all nodes in the MFFC are marked.

All the partitioning methods discussed above together with a proper engine selection allow the application of expensive Boolean methods in a controlled manner. The proper engine selection and the partition method influence and improve scalability and QoR for existing Boolean methods.

Boolean Difference Based Optimization

A new resubstitution framework based on Boolean difference is now described. The Boolean difference of a Boolean function $f(x_1, x_2, \ldots x_n)$ with respect to an input variable $x_i$ is defined as:

$$\frac{\partial f}{\partial x_i} = f_{x_i} \oplus f_{\overline{x_i}}$$

where $f_{x_i}$ and $f_{\overline{x_i}}$ are the cofactors with respect to variables $x_i$ and $\overline{x_i}$, respectively, and the $\oplus$ symbol is the XOR operator. The Boolean difference indicates whether function $f$ is sensitive to any changes in input $x_i$. Likewise, the Boolean difference of two Boolean functions $f(x_1, x_2, \ldots, x_n)$ and $g(x_1, x_2, \ldots, x_n)$ is defined as:

$$\frac{\partial f}{\partial g} = f \oplus g,$$

and it indicates whether the two functions are functionally equivalent (i.e., they have a difference equal to 0) or not (i.e., they have difference equal to 1). Further details of Boolean difference can be found in G. De Micheli, "Synthesis and Optimization of Digital Circuits", McGraw-Hill, New York, 1994, the contents of which are herein incorporated by reference in their entirety for all purposes.

Some embodiments described herein take advantage of the Boolean difference to build a resubstitution framework. As mentioned above, Boolean resubstitution is a Boolean optimization method that re-expresses the local function of an existing node using other nodes already present in the logic network. In our scenario, each function $f$ can be written as:

$$f = \frac{\partial f}{\partial g} \oplus g.$$

While g is a node already in the logic network, the main advantage comes from the synthesis of the Boolean difference between $f$ and g. A small Boolean difference implementation could result in size optimization for the logic network.

Figure 4A:
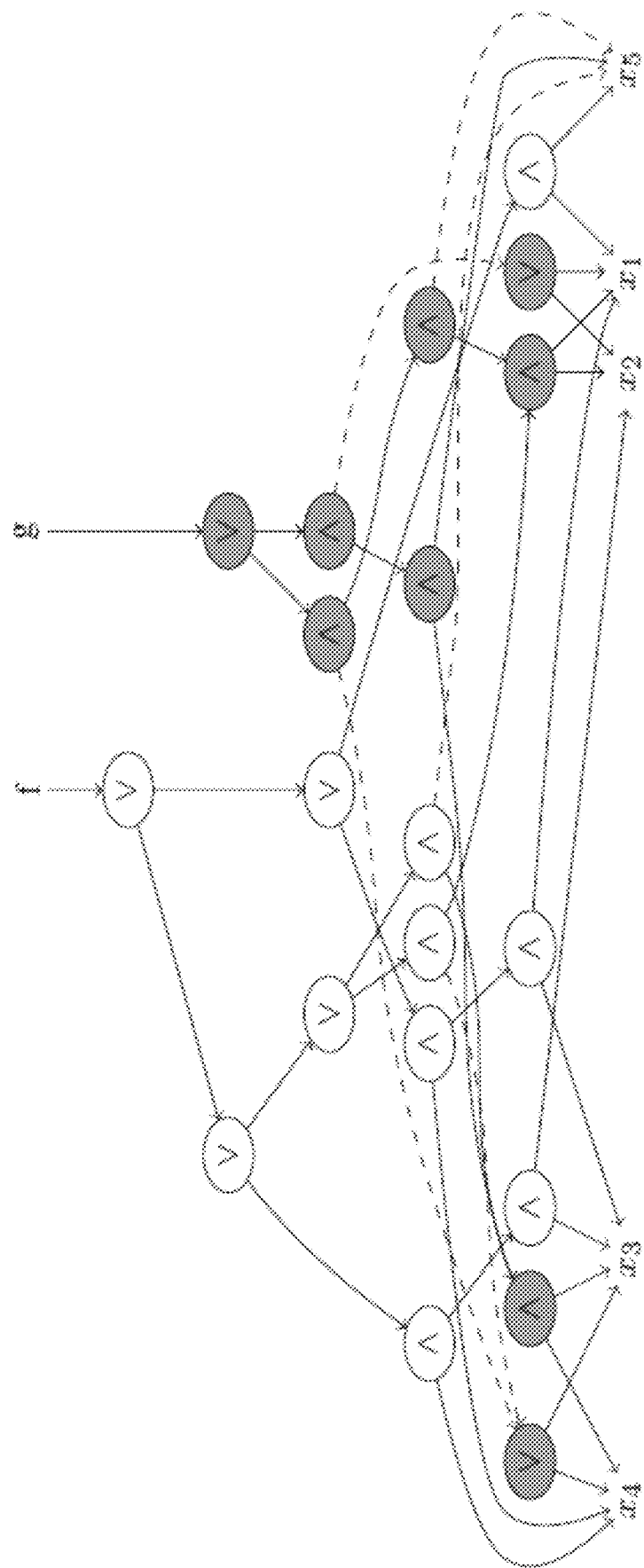
FIGS. 4A-4B illustrate how Boolean difference can be used to optimize a logic network in accordance with some embodiments described herein.
Figures 4B, 5:
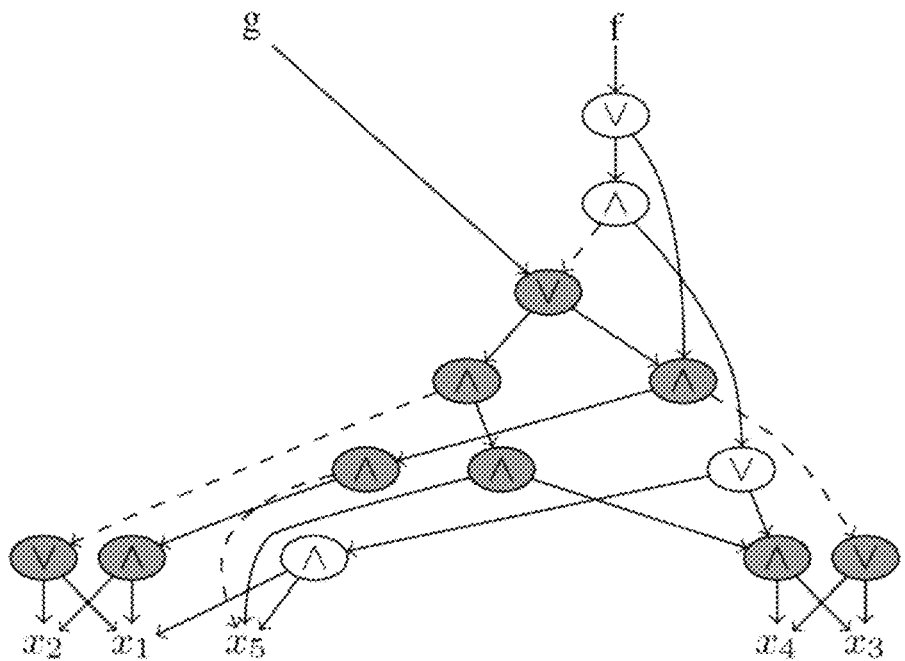
FIG. 5 illustrates a process for selecting candidates for Boolean difference based logic optimization in accordance with some embodiments described herein.

FIGS. 4A-4B illustrate how Boolean difference can be used to optimize a logic network in accordance with some embodiments described herein. Each node (represented by an oval) in FIGS. 4A-4B is a 2-input gate, and dashed edges represent inverters. Ovals with a "$\vee$" symbol represent a 2-input OR gate, and ovals with a "$\wedge$" symbol represent a 2-input AND gate. In FIGS. 4A-4B, the clear ovals correspond to function $f$, and the grey ovals correspond to function g. If we start at variables $x_1, \ldots, x_5$ shown at the bottom of FIGS. 4A-4B, and work our way up the network, then we arrive at the Boolean formula that defines logic functions $f$ and g.

FIG. 4A illustrates the original logic network, and FIG. 4B illustrates the logic network after Boolean difference based optimization is applied. Specifically, the function $f$ can be written as $$\frac{\partial f}{\partial g} \oplus g,$$

as shown in FIG. 4B. Note that, due the small size of the Boolean difference network, the total number of nodes is reduced in FIG. 4B, thereby achieving optimization with respect to FIG. 4A.

Some embodiments described herein use Boolean difference to perform network optimization. The main focus of this optimization is size optimization, the main objective are a small difference implementation and an efficient computation. In the following discussion, we refer to functions $f$ and g as candidates for Boolean difference, and to the inputs variables $x_1, x_2, \ldots, x_n$, as their support. First, we discuss how to select the candidates and their support such that their Boolean difference is "small". Then, we present processes to compute and implement the Boolean difference between two nodes. Finally, an embodiment that implements a global synthesis flow is described.

Before describing the node selection for Boolean difference based logic optimization, it is worth noting that our goal is a Boolean difference based approach which is part of a scalable resynthesis flow applied on large networks. Thus, we apply the Boolean difference method locally on small cuts off and g, using the leaves as support of the Boolean difference computation. The first step is the evaluation of the two cuts. These are obtained by fixing the numbers of logic levels l (the English lowercase letter "el") to be considered for each node. In case the level off and g are lower than l, PI as considered for the support. Once the number of levels for the cuts is decided, a filtering approach is applied to evaluate if $f$ and g could be validate candidates for the Boolean difference.

FIG. 5 illustrates a process for selecting candidates for Boolean difference based logic optimization in accordance with some embodiments described herein. The inputs to the procedure are the two subnetworks F and G obtained by the two cuts off and g, respectively, and the XOR cost. The XOR cost represents the cost of an XOR node in terms of the cost of AND and OR nodes. The XOR cost allows the process illustrated in FIG. 5 to control the substitutions that are worth being considered.

Function $f$ will be rewritten as $$\frac{\partial f}{\partial g} \oplus g,$$

and its MFFC can be removed from the entire network. Thus, the larger the MFFC of function $f$, the larger the size optimization (saving). A candidate is selected only if it will lead to savings (lines 2-8 in FIG. 5). The size of the MFFC can be easily obtained by applying the procedure shown in FIG. 3, and by counting the number of marked nodes. The process does not select a node if $f$ is in the sub-network or in the support of g (line 9-11 in FIG. 5). Nodes that have less than one common input are not considered for the Boolean difference (lines 12-15 in FIG. 5).

FIG. 6 illustrates a process for computing and implementing the Boolean difference of two candidate functions $f$ and g in accordance with some embodiments described herein. BDDs can be used as the data structure to compute the Boolean difference. In fact, as we control the size of the sub-networks by limiting the number of levels, the Boolean difference is computed between two small windows of logic. Further, BDDs allow a fast computation of the Boolean difference, and they can be easily translated into the correspondent logic network.

Line 2 computes the size of the MFFC of candidate $f$ (shown as "F" in FIG. 6). Lines 3 and 4 construct the BDD representations of candidates $f$ and g (shown as "G" in FIG. 6), and line 5 computes the difference between the two BDDs as the XOR (i.e., "$\oplus$") of the two BDDs. The quality of the substitution is controlled by lines 6-14 in FIG. 6. The checks in lines 6-14 enable a good control on the size of the BDD, and consequently on the size of the difference network. Specifically, ensuring that the size of the BDD of the difference is less than 10 allows the process to still have a gain (i.e., reduce the size of the optimized logic network) once the BDD is translated into the AIG. Cases with a small size saving are also skipped. It is worth highlighting that in our case, the BDD ordering does not play an important role, as we are dealing with small BDDs. The process illustrated in FIG. 6 saves runtime by not performing any BDD re-ordering. On the other hand, we increase the amount of memory that is used by the BDD package. Once the BDD of the difference is evaluated, it is translated into a logic network (lines 15-16 in FIG. 6). Specifically, the function F' is determined by computing the XOR between the Boolean difference node and G (line 16 in FIG. 6), and this function is returned as the optimized logic network (line 17 in FIG. 6) that was optimized by using the Boolean difference based logic optimization process.

Global Resubstitution Flow

Figure 7B:
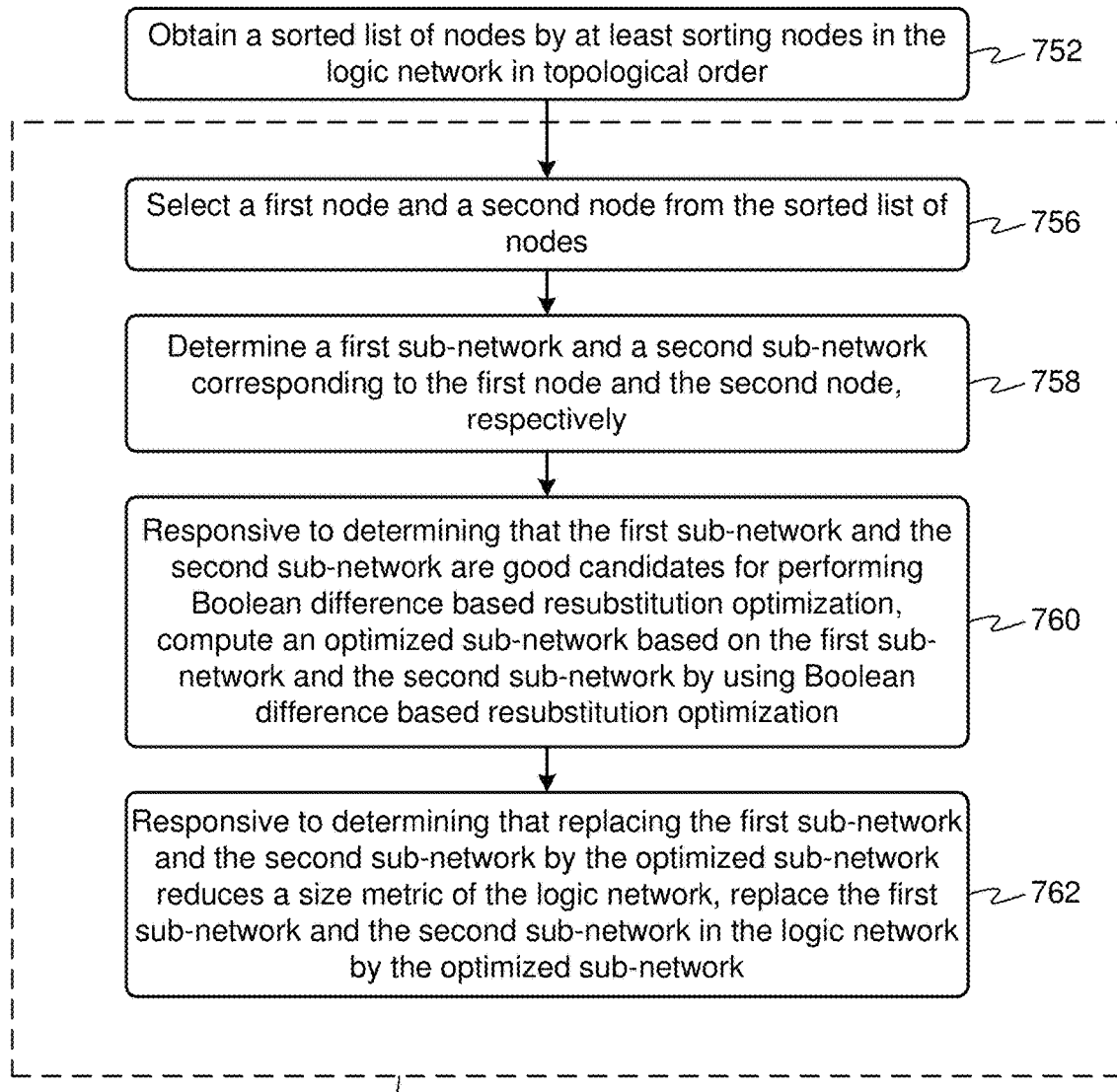

FIGS. 7A-7B illustrate a process for a resubstitution synthesis flow based on Boolean difference in accordance with some embodiments described herein. The inputs to the process illustrated in FIG. 7A are the logic network N that needs to be optimized, the number of levels l (the English lowercase letter "el") used to compute the cuts off and g, and the XOR cost. All nodes in the network are considered in topological order (lines 1-2, and the for-loops that begin on lines 3-4 in FIG. 7A), and nodes that correspond to the same function are skipped (lines 5-7 in FIG. 7A). Next, the two subnetworks are implemented according to the number of levels (lines 8-9 in FIG. 7A). The two subnetworks are then checked to be good candidates (lines 10-12 in FIG. 7A) using the procedure discussed in FIG. 5, and the new implementation of function f is achieved (line 13 in FIG. 7A) by using the BDD representations and the process described in FIG. 6. A new implementation of logic network F is accepted only if this leads to size decreasing (lines 14-21 in FIG. 7A).

In the embodiment shown in FIG. 7A, the process first picks the nodes in topological order from the global logic network, and then it limits the size of the subnetwork in order to ease the BDDs computation. In an alternative embodiment, the process can use a partition method first, and then select nodes already from the partition. In this embodiment, the BDDs can be computed using the primary inputs of the partition, without need to limit the number of levels as the size is limited by the partition method itself.

The process shown in FIG. 7B can begin by obtaining a sorted list of nodes by at least sorting nodes in the logic network in topological order (operation 752). In some embodiments, obtaining the sorted list of nodes comprises moving nodes that have similar structural support closer to one another in the sorted list of nodes while respecting the topological order.

Next, the process can iteratively perform a set of operations until logic optimization is complete (operation 754). The set of operations can include: selecting a first node and a second node from the sorted list of nodes (operation 756); determining a first sub-network and a second sub-network corresponding to the first node and the second node, respectively (operation 758); responsive to determining that the first sub-network and the second sub-network are good candidates for performing Boolean difference based resubstitution optimization, computing an optimized sub-network based on the first sub-network and the second sub-network by using Boolean difference based resubstitution optimization (operation 760); and responsive to determining that replacing the first sub-network and the second sub-network by the optimized sub-network reduces a size metric of the logic network, replacing the first sub-network and the second sub-network in the logic network by the optimized sub-network (operation 762).

In some embodiments, determining that the first sub-network and the second sub-network are good candidates for performing Boolean difference based resubstitution optimization comprises: determining a reconvergent maximum fanout free cone of the first sub-network; determining a count of input variables that are common to the first sub-network and the second sub-network; and determining whether or not the first sub-network and the second sub-network are good candidates for performing Boolean difference based resubstitution optimization based on the reconvergent maximum fanout free cone of the first sub-network and the count of input variables that are common to the first sub-network and the second sub-network.

In some embodiments, determining that replacing the first sub-network and the second sub-network by the optimized sub-network reduces the size metric of the logic network comprises: obtaining a resubstituted logic network by replacing the first sub-network and the second sub-network by the optimized sub-network; and comparing a size metric of the logic network with a size metric of the resubstituted logic network.

Enhancements to Optimization Engines

This section introduces several enhancements to traditional optimization engines. Part of these enhancements are due to the right choice of the data structure, and the suitable partition method. The partition methods described earlier in this disclosure play a key role in the implementation of gradient-based AIG minimization, and heterogeneous elimination for kernel extraction. The MSPF computation with BDDs is an improvement on existing techniques which used truth tables, and thus limited the number of inputs and solutions found.

An enhancement called the "gradient-based AIG minimization" improves classical AIG minimization by (i) using gradient based decomposition, and (ii) exploiting circuit partitioning techniques. AIG optimization tradionally consists of a predetermined sequence of primitive optimization techniques, forming a so called "script." Each primitive technique is homogeneously applied to the whole network. One of the most popular AIG script in academia is resyn2rs from ABC, with major primitive techniques being rewrite, refactor and resub. There has been recent work trying to apply machine learning to find better sequences of primitive optimization techniques (see e.g., C. Yu, H. Xiao, G. De Micheli, "Developing Synthesis Flows without Human Knowledge, Design Automation Conference (DAC), 2018).

Some embodiments described herein follow a different strategy from such recent approaches. In particular, some embodiments described herein aim at making AIG optimization automatically adaptive and diverse. These embodiments are adaptive because they learn on the fly what are the most effective AIG transformations, using gradient computation of the gain, and modify online what the next attempted transformations will be. These embodiments are diverse because they try different types of AIG transformations on the same region of logic and make results compete locally rather than globally. The embodiments consider best result selection performed either in parallel or in a waterfall model.

AIG optimization moves are defined to be primitive transformations that are applicable locally. Specifically, some embodiments consider the following moves: rewriting, refactoring, resub, MSPF resub and eliminate, simplify, and kerneling. All moves other than rewriting are available in low and high effort modes, trading runtime for QoR. All moves have an associated cost, which correlates to their runtime complexity. For example, rewriting and low-effort refactoring have unit cost, while MSPF resub has a cost of 3 units. High-effort versions have double the cost. More types of moves are also useful, but are omitted in this description for the sake of brevity.

The gradient based AIG engine runs together with a partitioning engine, either small scale or large scale depending on the intended scope of the optimization. First, unit cost moves are tried for each partition, with the best one selected, and the corresponding gain is recorded (all moves are designed to have gain>0 at all times, otherwise the corresponding change is reverted). Until gain>0, cheap moves are iterated over the network and all its partitions. At some point, the case gain=0 will appear as we hit a local minima. At that point higher cost moves start to be introduced in the AIG engine.

Recording of the most successful moves, and their sequence, can be done on the fly with respect to partitions and network structure. So moves with high success likelihood on the current design can be tried with higher priority in the next iterations. The gradient-based AIG engine is called together with a cost budget, which determines how many moves can be tried. Each move consumes its cost from the cost budget. The budget can be automatically increased by the AIG engine, if the gain gradient exceeds a certain threshold over last k iterations. In other words, this lets the AIG engine continue simplifying a logic network if the optimization trend is good enough. On the other hand, if the gain gradient is 0 over the last k iterations, the AIG engine can terminate early. Factors k and gain thresholds can be specified when running the AIG engine.

In experiments that were performed using the disclosed embodiments, a cost budget equal to 100 and k=20 with a minimum gain gradient equal to 3%, provided some of the best AIG optimizations seen over academic and industrial benchmarks.

An enhancement called the "heterogeneous elimination for kernel extraction" improves traditional kernel extraction, which is one of the most effective techniques in logic optimization (R. Brayton, C. McMullen, "The decomposition and factorization of Boolean expression", Proc. ISCAS, pp. 29-54, 1982). Kernel extraction is able to share large portions of logic circuits, which are hard to find with other techniques. For example, kernel extraction is capable of finding common factors between very wide (hundreds to thousands of inputs) operators appearing in HDL descriptions of decoders and control logic. Indeed, kernel extraction remains a fundamental step in EDA despite the lack of recent innovations on the subject. The effectiveness of kernel extraction stands on the properties and characteristics of the nodes' sum-of-products (SOPs). Indeed, prior to kernel extraction, node elimination is often used to create larger SOPs, keeping under control the maximum number of terms or literals, to enable more extraction opportunities to be found. (Node elimination, also known as forward node collapsing, aims at collapsing a node into its fanouts' SOPs. As a result, the node is eliminated.)

However, elimination is also usually run network-wise homogeneously, i.e., with the same thresholds on maximum number of terms or literals. This means that resulting SOPs will have somehow similar size—but not similar characteristics—which were the extraction opportunities arise. We enhance traditional elimination and kernel extraction to work on heterogeneous thresholds within the same network. The intuition is that some type of circuits "like" to be eliminated quite a lot, i.e., with large SOPs size, but other do not. For example, circuits containing parity and linear functions do not like to be eliminated at all, at least not into SOPs, so small eliminate thresholds should be used. On the other hand, circuits with few inversions and only AND/OR logic connectives typically enjoy being collapsed more before kernel extraction, so higher eliminate thresholds should be used in such cases. One could study the correlation between logic circuit characteristics and the associated effectiveness of elimination before performing kerneling, but this appears to be an intractable problem.

Embodiments disclosed herein take advantage of the above-mentioned partitioning engines, whose computation can be distributed in parallel, to accomplish heterogeneous elimination followed by kernel extraction. Specifically, we first partition the network, with given partition characteristics, and we apply elimination and kernel extraction to each partition with different eliminate thresholds. We only keep the best one, i.e., the one that reduces the most number of literals of the partition.

In some embodiments, the elimination process works as follows. We go over all nodes in the partition, and for each node, we estimate the variation in the number of literals in the partition that would result from the collapsing the node into its fanouts. If this variation is less than the specified threshold, the collapsing is performed. The operation is repeated until no node is collapsed into its fanouts. Empirically, we found it useful to try the following elimination thresholds: (−1, 2, 5, 20, 50, 100, 200, 300). Note that the threshold "−1" corresponds to no collapsing at all, which reflects the aforementioned case of parity functions.

The disclosed enhanced elimination and kernel extraction can exploit different characteristics of logic present within the same circuit. Even though kernel extraction is not a Boolean but an algebraic method, we categorized the elimination enhancement as a Boolean method because it applies to Boolean division as well, more generally.

Yet another enhancement involves MSPF computation with BDDs. Note that the choice of a different engine can impact not only the scalability of a Boolean method, but also the QoR. The maximum set of permissible functions is one of the most powerful interpretation of don't cares for synthesis. Some embodiments described herein use a BDD-based version of MSPF logic optimization, intended to work on larger sub-circuits than those considered in previous approaches, such as the ones generated by large scale partitioning.

The BDD-based MSPF optimization process operates as follows. First, nodes are arranged in topologically ordered array, which is further sorted with respect to the estimated saving metric for each node. Then, the method considers each node in the array. The MSPF information is computed for the current node via co-factoring. Specifically, the positive (negative) cofactor of the node with respect to each primary output is computed using BDDs (see e.g., Drechsler, R., and Becker, B., "Binary decision diagrams: theory and implementation", Springer Science & Business Media, 2013), and stored as an array of BDD formulas, $f_0$ ($f_1$), with size=|PO|. At this point, the mspf(node) information is initialized to logic 1: mspf(node)=bdd(1).

Then, the actual computation loops over all POs, and updates the MSPF as: mspf(node)=mspf(node)$\land$($f_0$($po_i$)$\odot f_1$($po_i$))$\lor$dc($po_i$)), where $po_i$ is the $i^{th}$ PO under consideration, $\odot$ is the XNOR binary operator and dc($po_i$) is any pre-existing don't care condition at the $i^{th}$ PO. If at any point of the loop mspf(node)=bdd(0), then the computation stops early as no MSPF was found for the current node. Otherwise, the MSPF information is passed to drive the successive optimization steps.

Based on the permissible functions computed, the fanin of the current node can be "redone" to reduce area, or other optimization metrics. For example, it is efficient to check via BDDs if changing a fanin of node still respects: bdd(node$_{new}$)$\land\neg$mspf(node)=bdd(node$_{old}$)$\lor\neg$mspf(node). In that case, then the fanin is "connectable" as it generates a permissible function at the current node. From there, standard MSPF optimization techniques can be applied on top.

Another key enhancement to this technique, as compared to existing approaches, is to look not just for one but for many connectable fanins under MSPF, and then find an irredundant subset of those to try. With truth tables, or even SAT, finding many connectable fanins would be quite expensive, but with BDDs it is possible to perform such global queries more efficiently thanks to canonicity (see e.g., Randal E. Bryant. "Graph-Based Algorithms for Boolean Function Manipulation". IEEE Trans. on Computers, 35(8): 677691, 1986). As a consequence, QoR improves with BDD-based MSPF because of the larger subset of solutions reachable.

Figure 8:
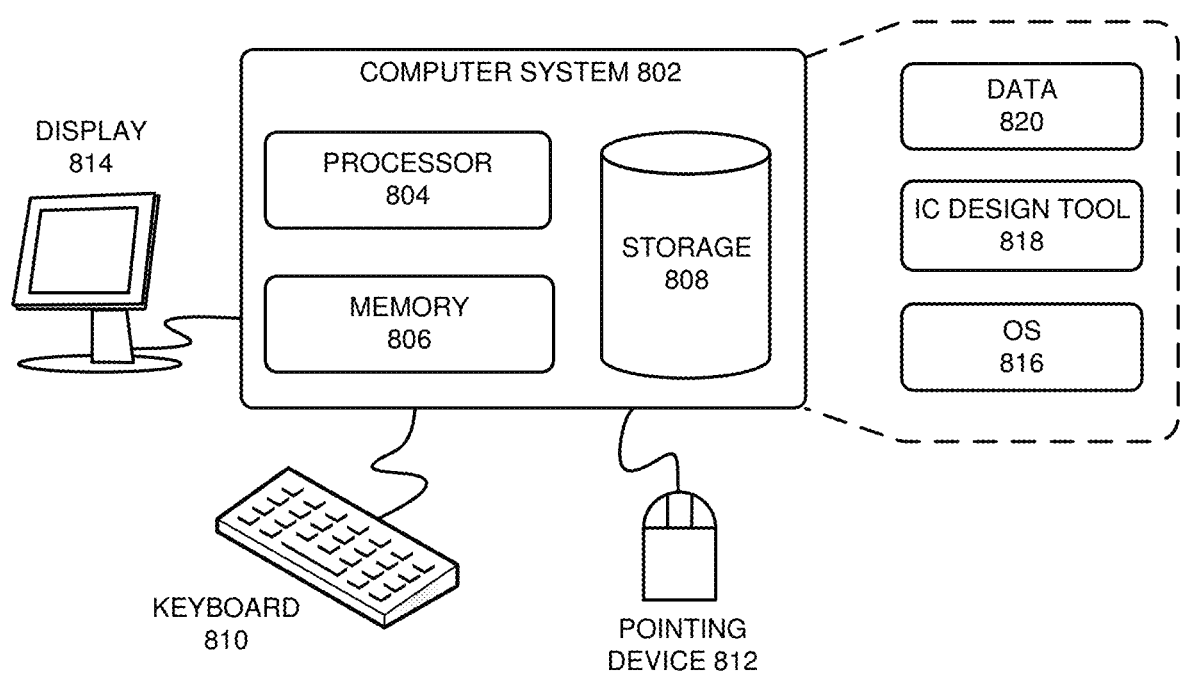
FIG. 8 illustrates a computer system in accordance with some embodiments described herein.

FIG. 8 illustrates a computer system in accordance with some embodiments described herein. The term "computer" or "computer system" generally refers to a hardware-based system that can perform computations required for the design and manufacture of ICs. Computer system 802 can include processor 804, memory 806, and storage device 808. Computer system 802 may include multiple processors, and processor 804 may include multiple cores. Specifically, memory locations in memory 806 can be addressable by processor 804, thereby enabling processor 804 to access (e.g., via load/store instructions) and manipulate (e.g., via logical/floating point/arithmetic instructions) the data stored in memory 806. Computer system 802 can be coupled to display device 814, keyboard 810, and pointing device 812. Storage device 808 can store operating system 816, IC design tool 818, and data 820. Data 820 can include input required by IC design tool 818 and/or output generated by IC design tool 818.

Computer system 802 may automatically (or with user help) perform one or more operations that are implicitly or explicitly described in this disclosure. Specifically, computer system 802 can load IC design tool 818 into memory 806, and IC design tool 818 can then be used to perform logic optimization using the above-mentioned processes. The resulting IC chips can have better performance, manufacturing yield, and/or quality because of the logic optimization that was performed using the disclosed processes.

While 'data' and 'information' often are used interchangeably (e.g., 'data processing' and 'information processing'), the term 'datum' (plural 'data') typically signifies a representation of the value of a measurement of a physical quantity (e.g., the current in a wire), or the answer to a question (e.g., "yes" or "no"), while the term 'information' typically signifies a structured set of data (often times signified by 'data structure'). A specified data structure is used to structure an electronic device to be used as a specific machine as an article of manufacture (see In re Lowry, 32 F.3d 1579 [CAFC, 1994]). Data and information are physical, for example binary data (a 'bit', usually signified with '0' and '1') enabled with two different levels of voltage in a circuit. For example, data can be enabled as an electrical, magnetic, optical or acoustical signal; a quantum state such as spin that enables a 'qubit'; or a physical state of an atom or molecule. All such data and information, when enabled, are stored, accessed, transferred, combined, compared, or otherwise acted upon, actions that require energy.

As used herein, the term 'process' signifies an unnatural sequence of physical actions and/or transformations (both also referred to as 'operations' or 'steps') to produce at least one result. The actions and transformations are technical applications of one or more natural laws of science or unnatural laws of technology. The actions and transformations often change the physical state of a machine, of structures of data and information, or of a composition of matter. Two or more actions can occur at about the same time, or one action can occur before or after another action, if they produce the same result. A description of the physical actions and/or transformations that comprise a process are often signified with a set of gerund phrases (or their semantic equivalents) that are typically preceded with the signifier 'the steps of' (e.g., "a process comprising the steps of measuring, transforming, partitioning and then distributing . . . "). The signifiers 'algorithm', 'method', 'procedure', '(sub)routine', 'protocol', 'recipe', and 'technique' often are used interchangeably with 'process', and 35 U.S.C. 100 defines a "method" as one type of process that is, by statutory law, always patentable under 35 U.S.C. 101. Many forms of knowledge, learning, skills and styles are authored, structured, and enabled-objectively—as processes—e.g., knowledge and learning as functions in knowledge programming languages. As used herein, the term 'rule' signifies a process with at least one conditional test (signified, e.g., by 'IF test THEN process'). As used herein, the term 'thread' signifies a sequence of operations or instructions that comprise a subset of an entire process. A process can be partitioned into multiple threads that can be used at or about at the same time.

As used herein, the term 'component' (also signified by 'part', and typically signified by 'element' when described in a patent text or diagram) signifies a physical object that is used to enable a process in combination with other components. For example, electronic components are used in processes that affect the physical state of one or more ('ensemble') electromagnetic or quantum particles/waves (e.g., electrons, photons) or quasiparticles (e.g., electron holes, phonons, magnetic domains) and their associated fields or signals. Electronic components have at least two connection points to which are attached 'leads', typically a wire with one end attached to the component and the other end attached to another component, typically as part of a circuit with current flows. There are at least three types of electrical components: passive, active and electromechanical. Passive electronic components typically do not introduce energy into a circuit—such components include resistors, memristors, capacitors, magnetic inductors, crystals, Josephson junctions, transducers, sensors, antennas, waveguides, etc. Active electronic components require a source of energy and can inject energy into a circuit—such components include semiconductors (e.g., diodes, transistors, optoelectronic devices), vacuum tubes, batteries, power supplies, displays (e.g., LEDs, LCDs, lamps, CRTs, plasma displays). Electromechanical components affect current flow using mechanical forces and structures—such components include switches, relays, protection devices (e.g., fuses, circuit breakers), heat sinks, fans, cables, wires, terminals, connectors and printed circuit boards. As used herein, the term 'netlist' is a specification of the components comprising an electric circuit, and electrical connections between the components. The programming language for the SPICE circuit simulation program is often used to specify a netlist. In the context of circuit design, the term 'instance' signifies each time a component is specified in a netlist.

One of the most important components as goods in commerce is the integrated circuit, and its res of abstractions. As used herein, the term 'integrated circuit' signifies a set of connected electronic components on a small substrate (thus the use of the signifier 'chip') of semiconductor material, such as silicon or gallium arsenide, with components fabricated on one or more layers. Other signifiers for 'integrated circuit' include 'monolithic integrated circuit', 'IC', 'chip', 'microchip' and 'System on Chip' ('SoC'). Types of integrated circuits include gate/logic arrays, processors, memories, interface chips, power controllers, and operational amplifiers. The term 'cell' as used in electronic circuit design signifies a specification of one or more components, for example, a set of transistors that are connected to function as a logic gate. Cells are usually stored in a database, to be accessed by circuit designers and design processes.

As used herein, the term 'module' signifies a tangible structure for acting on data and information that typically is limited in size and/or complexity. For example, the term 'module' can signify one or more processes that transforms data and information, for example, processes comprising a computer program. The term 'module' also can signify one or more interconnected electronic components, such as digital logic devices. A process comprising a module, if specified in a programming language, such as System C or Verilog, also can be transformed into a specification for a structure of electronic components that transform data and information that produce the same result as the process. This last sentence follows from a modified Church-Turing thesis, which is simply expressed as "Whatever can be transformed by a (patentable) process and a processor, can be transformed by a (patentable) equivalent set of modules.", as opposed to the doublethink of deleting only one of the "(patentable)".

A module is permanently structured (e.g., circuits with unalterable connections), temporarily structured (e.g., circuits or processes that are alterable with sets of data), or a combination of the two forms of structuring. Permanently structured modules can be manufactured, for example, using Application Specific Integrated Circuits ('ASICs') such as Arithmetic Logic Units ('ALUs'), Programmable Logic Arrays ('PLAs'), or Read Only Memories ('ROMs'), all of which are typically structured during manufacturing. For example, a permanently structured module can comprise an integrated circuit. Temporarily structured modules can be manufactured, for example, using Field Programmable Gate Arrays (FPGAs—for example, sold by Xilink or Intel's Altera), Random Access Memories (RAMs) or microprocessors. For example, data and information is transformed using data as an address in RAM or ROM memory that stores output data and information. One can embed temporarily structured modules in permanently structured modules (for example, a FPGA embedded into an ASIC).

Modules that are temporarily structured can be structured during multiple time periods. For example, a processor comprising one or more modules has its modules first structured by a manufacturer at a factory and then further structured by a user when used in commerce. The processor can comprise a set of one or more modules during a first time period, and then comprise a different set of one or modules during a second time period. The decision to manufacture or implement a module in a permanently structured form, in a temporarily structured form, or in a combination of the two forms, depends on issues of commerce such as cost, time considerations, resource constraints, tariffs, maintenance needs, national intellectual property laws, and/or specific design goals. How a module is used is mostly independent of the physical form in which it is manufactured or enabled. This last sentence also follows from the modified Church-Turing thesis.

As used herein, the term 'processor' signifies a tangible data and information processing machine for use in commerce that physically transforms, transfers, and/or transmits data and information, using at least one process. A processor consists of one or more modules (e.g., a central processing unit, 'CPU'; an input/output (I/O') controller, a memory controller, a network controller, and other modules). The term 'processor' can signify one or more processors, or one or more processors with multiple computational cores/CPUs, specialized processors (for example, graphics processors or signal processors), and their combinations. Where two or more processors interact, one or more of the processors can be remotely located. Where the term 'processor' is used in another context, such as a 'chemical processor', it will be signified and defined in that context.

The processor can comprise, for example, digital logic circuitry (for example, a binary logic gate), and/or analog circuitry (for example, an operational amplifier). The processor also can use optical signal processing, DNA transformations or quantum operations, microfluidic logic processing, or a combination of technologies, such as an optoelectronic processor. For data and information structured with binary data, any processor that can transform data and information using the AND, OR and NOT logical operations (and their derivatives, such as the NAND, NOR, and XOR operations) also can transform data and information using any function of Boolean logic. A processor such as an analog processor, such as an artificial neural network, also can transform data and information. No scientific evidence exists that any of these technological processors are processing, storing and retrieving data and information, using any process or structure equivalent to the bioelectric structures and processes of the human brain.

The one or more processors also can use a process in a 'cloud computing' environment, where time and resources of multiple remote computers are shared by multiple users or processors communicating with the computers. For example, a group of processors can use at least one process available at a distributed or remote system, these processors using a communications network (e.g., the Internet, or an Ethernet) and using one or more specified interfaces (e.g., an application program interface ('APP) that signifies functions and data structures to communicate with the remote process).

As used herein, the term 'computer' and 'computer system' (further defined below) includes at least one processor that, for example, performs operations on data and information such as (but not limited to) the AND, OR and NOT logical operations using electronic gates that can comprise transistors, with the addition of memory (for example, memory structured with flip-flops using the NOT-AND or NOT-OR operation). Such a processor is Turing-complete and computationally universal. A computer can comprise a simple structure, for example, comprising an I/O module, a CPU, and a memory that performs, for example, the process of inputting a signal, transforming the signal, and outputting the signal with no human intervention.

As used herein, the term 'programming language' signifies a structured grammar for specifying sets of operations and data for use by modules, processors and computers. Programming languages include assembler instructions, instruction-set-architecture instructions, machine instructions, machine dependent instructions, microcode, firmware instructions, state-setting data, or either source code or object code written in any combination of one or more higher level languages, for example, the C programming language and similar general programming languages (such as Fortran, Basic, Javascript, PHP, Python, C++), knowledge programming languages (such as Lisp, Smalltalk, Prolog, or CycL), electronic structure programming languages (such as VHDL, Verilog, SPICE or SystemC), text programming languages (such as SGML, HTML, or XML), or audiovisual programming languages (such as SVG, MathML, X3D/VRML, or MIDI), and any future equivalent programming languages. As used herein, the term 'source code' signifies a set of instructions and data specified in text form using a programming language. A large amount of source code for use in enabling any of the claimed inventions is available on the Internet, such as from a source code library such as Github.

As used herein, the term 'program' (also referred to as an 'application program') signifies one or more processes and data structures that structure a module, processor or computer to be used as a "specific machine" (see In re Alappat, 33 F3d 1526 [CAFC, 1991]). One use of a program is to structure one or more computers, for example, standalone, client or server computers, or one or more modules, or systems of one or more such computers or modules. As used herein, the term 'computer application' signifies a program that enables a specific use, for example, to enable text processing operations, or to encrypt a set of data. As used herein, the term 'firmware' signifies a type of program that typically structures a processor or a computer, where the firmware is smaller in size than a typical application program, and is typically not very accessible to or modifiable by the user of a computer. Computer programs and firmware are often specified using source code written in a programming language, such as C. Modules, circuits, processors, programs, and computers can be specified at multiple levels of abstraction, for example, using the SystemC programming language, and have value as products in commerce as taxable goods under the Uniform Commercial Code (see U.C.C. Article 2, Part 1).

A program is transferred into one or more memories of the computer or computer system from a data and information device or storage system. A computer system typically has a device for reading storage media that is used to transfer the program, and/or has an interface device that receives the program over a network. This process is discussed in the General Computer Explanation section.

The signifier 'commercial solution' signifies, solely for the following paragraph, an engineering domain-specific (and thus non-preemptive—see Bilski): electronic structure, a process for a specified machine, a manufacturable circuit (and their Church-Turing equivalents) or a composition of matter that applies science and/or technology in commerce to solve a technical problem.

The signifier 'abstract' (when used in a patent claim for any enabled embodiments disclosed herein for a new commercial solution that is a scientific use of one or more laws of nature {see Benson}, and that solves a problem of technology {see Diehr} used in commerce—or improves upon an existing commercial solution {see Diehr})—is precisely defined by the inventor(s) {see MPEP 2111.01 (9th edition, Rev. 08.2017)} as follows:

a) a new commercial solution is 'abstract' if it is not novel (e.g., it is so well known in equal prior art {see Alice} and/or the use of equivalent prior art solutions is long prevalent {see Bilski} in science, engineering or commerce), and thus unpatentable under 35 U.S.C. 102, for example, because it is 'difficult to understand' {see Merriam-Webster definition for 'abstract' } how the commercial solution differs from equivalent prior art solutions; or
  b) a new commercial solution is 'abstract' if it is obvious, that is, if the existing prior art includes at least one analogous prior art solution {see KSR}, or the existing prior art includes at least two prior art publications that can be combined {see Alice} by a skilled person {often referred to as a THOSITA', see MPEP 2141-2144 (9th edition, Rev. 08.2017)} to be equivalent to the new commercial solution, and is thus unpatentable under 35 U.S.C. 103, for example, because it is 'difficult to understand' how the new commercial solution differs from a PHOSITA-combination/-application of the existing prior art; or
  c) a new commercial solution is 'abstract' if it is not disclosed with a description that enables its praxis, either because insufficient guidance exists in the description, or because only a generic implementation is described {see Mayo} with unspecified components, parameters or functionality, so that a PHOSITA is unable to instantiate an embodiment of the new solution for use in commerce, without, for example, requiring special programming {see Katz} (or, e.g., circuit design) to be performed by the PHOSITA, and is thus unpatentable under 35 U.S.C. 112, for example, because it is 'difficult to understand' how to use in commerce any embodiment of the new commercial solution.

The Detailed Description signifies in isolation the individual features, structures, functions, or characteristics described herein and any combination of two or more such features, structures, functions or characteristics, to the extent that such features, structures, functions or characteristics or combinations thereof are enabled by the Detailed Description as a whole in light of the knowledge and understanding of a skilled person, irrespective of whether such features, structures, functions or characteristics, or combinations thereof, solve any problems disclosed herein, and without limitation to the scope of the Claims of the patent. When an embodiment of a claimed invention comprises a particular feature, structure, function or characteristic, it is within the knowledge and understanding of a skilled person to use such feature, structure, function, or characteristic in connection with other embodiments whether or not explicitly described, for example, as a substitute for another feature, structure, function or characteristic.

In view of the Detailed Description, a skilled person will understand that many variations of the claimed inventions can be enabled, such as function and structure of elements, described herein while remaining in the domain of the claimed inventions. One or more elements of an embodiment can be substituted for one or more elements in another embodiment, as will be understood by a skilled person. Writings about embodiments signify their uses in commerce, thereby enabling other skilled people to similarly use in commerce.

This Detailed Description is fitly written to provide knowledge and understanding. It is neither exhaustive nor limiting of the precise structures described, but is to be accorded the widest scope consistent with the disclosed principles and features. A skilled person can enable many equivalent variations. Without limitation, any and all equivalents described, signified or Incorporated By Reference in this patent application are specifically Incorporated By Reference into the Detailed Description. In addition, any and all variations described, signified or Incorporated By Reference with respect to any one claimed invention and its embodiment also are included with all other claimed inventions and their embodiments. Any such variations include both currently known variations as well as future variations, for example any element used for enablement includes a future equivalent element that provides the same function, regardless of the structure of the future equivalent element.

It is intended that the domain of the set of claimed inventions and their embodiments be defined and judged by the following Claims and their equivalents. The Detailed Description includes the following Claims, with each Claim standing on its own as a separate claimed invention. The embodiments of the claimed inventions can have more structure and features than are explicitly specified in the Claims.

The foregoing embodiments have been presented for purposes of illustration and description. They are not intended to be exhaustive or to limit the scope of this disclosure to the forms disclosed. Accordingly, many modifications and variations will be apparent to practitioners skilled in the art. Additionally, the above disclosure is not intended to limit the disclosed subject matter. The scope of the claimed invention(s) is defined by the appended claims.

What is claimed is:

1. A non-transitory computer-readable storage medium comprising stored instructions, which when executed by a processor, cause the processor to:
    analyze a set of characteristics of the logic network, the set of characteristics including a count of primary inputs of the logic network;
    select a logic optimization engine based on said analyzing, the logic optimization engine being selected from a group comprising a truth-table based logic optimization engine, a binary decision diagram (BDD) based logic optimization engine, and a satisfiability (SAT) based logic optimization engine; and
    optimize the logic network by using the logic optimization engine.

2. The non-transitory computer-readable storage medium of claim 1, wherein the set of characteristics includes a depth of an and-inverter-graph (AIG) decomposition of the logic network.

3. The non-transitory computer-readable storage medium of claim 1, wherein the set of characteristics includes a ratio between a count of internal nodes of the logic network and the count of primary inputs of the logic network.

4. The non-transitory computer-readable storage medium of claim 1, wherein the set of characteristics includes a monotonicity characteristic that indicates whether or not the logic network shows monotonicity.

5. The non-transitory computer-readable storage medium of claim 1, wherein the set of characteristics includes a symmetry characteristic that indicates whether or not the logic network shows symmetry.

6. The non-transitory computer-readable storage medium of claim 1, wherein said selecting the logic optimization engine comprises selecting the truth-table based logic optimization engine when the count of primary inputs of the logic network is less than a first predetermined value.

7. The non-transitory computer-readable storage medium of claim 6, wherein said selecting the logic optimization engine comprises selecting the BDD based logic optimization engine when the count of primary inputs of the logic network is greater than or equal to a first predetermined value, but less than a second predetermined value.

8. The non-transitory computer-readable storage medium of claim 7, wherein said selecting the logic optimization engine comprises selecting the SAT based logic optimization engine when the count of primary inputs of the logic network is greater than or equal to the second predetermined value.

9. A method for optimizing a logic network, the method comprising:
    automatically analyzing, by a processor, a set of characteristics of the logic network, the set of characteristics including a count of primary inputs of the logic network;
    automatically selecting a logic optimization engine based on said analyzing, the logic optimization engine being selected from a group comprising a truth-table based logic optimization engine, a binary decision diagram (BDD) based logic optimization engine, and a satisfiability (SAT) based logic optimization engine; and
    automatically optimizing the logic network by using the logic optimization engine.

10. The method of claim 9, wherein the set of characteristics includes a depth of an and-inverter-graph (AIG) decomposition of the logic network.

11. The method of claim 9, wherein the set of characteristics includes a ratio between a count of internal nodes of the logic network and the count of primary inputs of the logic network.

12. The method of claim 9, wherein the set of characteristics includes a monotonicity characteristic that indicates whether or not the logic network shows monotonicity.

13. The method of claim 9, wherein the set of characteristics includes a symmetry characteristic that indicates whether or not the logic network shows symmetry.

14. The method of claim 9, wherein said selecting the logic optimization engine comprises selecting the truth-table based logic optimization engine when the count of primary inputs of the logic network is less than a first predetermined value.

15. The method of claim 14, wherein said selecting the logic optimization engine comprises selecting the BDD based logic optimization engine when the count of primary inputs of the logic network is greater than or equal to a first predetermined value, but less than a second predetermined value.

16. The method of claim 15, wherein said selecting the logic optimization engine comprises selecting the SAT based logic optimization engine when the count of primary inputs of the logic network is greater than or equal to the second predetermined value.

17. A system comprising:
    a memory storing instructions; and
    a processor, coupled with the memory and to execute the instructions, the instructions when executed cause the processor to:
        analyze a set of characteristics of the logic network, the set of characteristics including a count of primary inputs of the logic network;
        select a logic optimization engine based on said analyzing, the logic optimization engine being selected from a group comprising a truth-table based logic optimization engine, a binary decision diagram (BDD) based logic optimization engine, and a satisfiability (SAT) based logic optimization engine; and
        optimize the logic network by using the logic optimization engine.

18. The system of claim 17, wherein the set of characteristics includes a depth of an and-inverter-graph (AIG) decomposition of the logic network.

19. The system of claim 17, wherein the set of characteristics includes a ratio between a count of internal nodes of the logic network and the count of primary inputs of the logic network.

20. The system of claim 17, wherein the set of characteristics includes a monotonicity characteristic that indicates whether or not the logic network shows monotonicity.

* * * * *